(12) United States Patent
Chen et al.

(10) Patent No.: US 11,916,008 B2
(45) Date of Patent: Feb. 27, 2024

(54) CHIP-ON-FILM PACKAGING STRUCTURE AND CHIP-ON-FILM PACKAGING METHOD

(71) Applicant: WUHAN CHINA STAR OPTOELECTRONICS SEMICONDUCTOR DISPLAY TECHNOLOGY CO., LTD., Wuhan (CN)

(72) Inventors: Yicheng Chen, Wuhan (CN); Hong Wen, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 384 days.

(21) Appl. No.: 17/261,756

(22) PCT Filed: Sep. 3, 2020

(86) PCT No.: PCT/CN2020/113231
§ 371 (c)(1),
(2) Date: Jan. 20, 2021

(87) PCT Pub. No.: WO2022/036763
PCT Pub. Date: Feb. 24, 2022

(65) Prior Publication Data
US 2022/0199496 A1    Jun. 23, 2022

(30) Foreign Application Priority Data

Aug. 20, 2020 (CN) .......................... 202010842783.3

(51) Int. Cl.
*H01L 23/498* (2006.01)
*H01L 21/48* (2006.01)
(Continued)

(52) U.S. Cl.
CPC ...... *H01L 23/4985* (2013.01); *H01L 21/4853* (2013.01); *H01L 23/13* (2013.01);
(Continued)

(58) Field of Classification Search
CPC . H01L 21/4853; H01L 23/4985; H01L 23/13; H01L 23/49816; H01L 24/32;
(Continued)

(56) References Cited

U.S. PATENT DOCUMENTS 6,495,914 B1 * 12/2002 Sekine ..................... H01L 25/50
257/E21.705
6,734,535 B1 * 5/2004 Hashimoto ....... H01L 23/49816
257/737
(Continued)

FOREIGN PATENT DOCUMENTS

CN          1532921 A       9/2004
CN        101295682 A      10/2008
(Continued)

*Primary Examiner* — Jasmine J Clark
(74) *Attorney, Agent, or Firm* — The Roy Gross Law Firm, LLC; Roy Gross

(57) ABSTRACT

The present invention provides a chip-on-film (COF) packaging structure and a COF packaging method. The COF packaging structure includes a flexible substrate and a chip. The flexible substrate includes a first groove provided on a first surface of the flexible substrate, a protrusion provided in the first groove, and a substrate bonding pad disposed in the first groove. The chip includes a second groove provided on a second surface of the chip, and a chip bonding pad disposed on the second surface and corresponding to the substrate bonding pad. The first groove of the flexible substrate is matched with a peripheral shape of the chip, and the second groove is matched with the protrusion of the first (Continued)

groove to embed the chip in the flexible substrate. The chip bonding pad is electrically connected to the substrate bonding pad.

17 Claims, 3 Drawing Sheets

(51) Int. Cl.
*H01L 23/13* (2006.01)
*H01L 23/00* (2006.01)

(52) U.S. Cl.
CPC .............. *H01L 24/32* (2013.01); *H01L 24/83* (2013.01); *H01L 2224/32227* (2013.01); *H01L 2224/83851* (2013.01)

(58) Field of Classification Search
CPC ........... H01L 24/83; H01L 2224/32227; H01L 2224/49838; H01L 2224/81986
USPC ........................................................ 257/668
See application file for complete search history.

(56) References Cited

U.S. PATENT DOCUMENTS

| | | |
|---|---|---|
| 6,838,758 B1 | 1/2005 | Montiel |
| 2014/0264860 A1 | 9/2014 | Hsien |

FOREIGN PATENT DOCUMENTS

| | | | |
|---|---|---|---|
| CN | 101483158 A | 7/2009 | |
| CN | 110379312 A | 10/2019 | |
| CN | 111370336 A | 7/2020 | |

\* cited by examiner

CHIP-ON-FILM PACKAGING STRUCTURE AND CHIP-ON-FILM PACKAGING METHOD

CROSS REFERENCE TO RELATED APPLICATIONS

This application is a National Phase of PCT Patent Application No. PCT/CN2020/113231 having International filing date of Sep. 3, 2020, which claims the benefit of priority of Chinese Application No. 202010842783.3 filed Aug. 20, 2020. The contents of the above applications are all incorporated by reference as if fully set forth herein in their entirety.

FIELD OF INVENTION

The present invention is related to the field of chip bonding technology, and specifically, to a chip-on-film packaging structure and a chip-on-film packaging method.

BACKGROUND OF INVENTION

In a traditional display screen, its chip is bonded on a glass substrate at a bezel of the display screen by a chip-on-glass (COG) packaging method. This method can effectively reduce a volume of a driving module of the display screen, thereby providing a larger space inside an electronic device using this display screen to accommodate other electronic components.

With development of display technology and consumer demand, a demand for display screen with narrow bezels is increased, and new technologies have emerged. A chip-on-film (COF) packaging method plays an important role in a narrow bezel display screen. The COF packaging method bonds a chip of the display screen to a flexible substrate of the display screen, which not only has advantages of the COG packaging method, but also can further reduce a bezel width of the display screen.

A design of a traditional COF packaging method increases an overall thickness of the flexible substrate and the chip, which is not conducive to an internal space arrangement of the electronic device. Meanwhile, a configuration of bonding a rigid chip on the flexible substrate causes risks of water vapor interference and a chip displacement on a side of the chip.

Therefore, there is a need for an improved COF packaging structure and method to reduce the overall thickness of the traditional COF packaging structure, increase a tightness of bonding between the chip and the flexible substrate, and strengthen a stability of the bonding between the chip and the flexible substrate.

SUMMARY OF INVENTION

In order to solve the above problems, the present invention provides a chip-on-film (COF) packaging structure. The COF packaging structure includes: a flexible substrate including a first groove provided on a first surface of the flexible substrate, a protrusion provided in the first groove, and a substrate bonding pad disposed in the first groove; and a chip including a second groove provided on a second surface of the chip, and a chip bonding pad disposed on the second surface and corresponding to the substrate bonding pad. The first groove of the flexible substrate is matched with a peripheral shape of the chip, and the second groove is matched with the protrusion of the first groove to embed the chip in the flexible substrate. The chip bonding pad is electrically connected to the substrate bonding pad.

In the COF packaging structure of the present invention, a shape of the protrusion of the first groove includes a columnar shape or an embankment shape.

In the COF packaging structure of the present invention, the protrusion of the first groove is provided at a corner or an edge of the first groove.

In the COF packaging structure of the present invention, a depth of the first groove ranges from 10 microns to 100 microns.

In the COF packaging structure of the present invention, a gap between the chip and the first groove of the flexible substrate ranges from 10 microns to 30 microns.

In the COF packaging structure of the present invention, a gap between the chip and the first groove of the flexible substrate is filled with a sealant.

In the COF packaging structure of the present invention, the chip bonding pad is electrically connected to the substrate bonding pad through an anisotropic conductive film.

In the COF packaging structure of the present invention, the first groove of the flexible substrate is formed by etching through a photolithography process.

In the COF packaging structure of the present invention, the second groove of the chip is formed by etching through a photolithography process.

The present further provides a chip-on-film (COF) packaging method. The COF packaging method includes steps of:
  step S10: providing a flexible substrate and a chip;
  step S20: forming a first groove on a first surface of the flexible substrate, wherein the first groove is matched with a peripheral shape of the chip, and the first groove is provided with a protrusion;
  step S30: disposing a substrate bonding pad in the first groove of the flexible substrate;
  step S40: forming a second groove on a second surface of the chip matched with the protrusion of the first groove;
  step S50: disposing a chip boding pad on the second surface of the chip corresponding to the substrate bonding pad; and
  step S60: embedding the chip in the flexible substrate and electrically connecting the chip bonding pad and the substrate bonding pad.

The COF packaging method of the present invention further includes a step of:
  step S70: filling a gap between the chip and the first groove of the flexible substrate with a sealant.

In the COF packaging method of the present invention, step S20 further includes a step of:
  step S21: etching the first surface of the flexible substrate to form the first groove through a photolithography process.

In the COF packaging method of the present invention, in step S20, the protrusion of the first groove is formed in a columnar shape or an embankment shape.

In the COF packaging method of the present invention, in step S20, the protrusion of the first groove is formed at a corner or an edge of the first groove.

In the COF packaging method of the present invention, step S40 further includes a step of:
  step S41: etching the second surface of the chip to form the second groove through a photolithography process.

In the COF packaging method of the present invention, step S60 further includes a step of:
  step S61: attaching an anisotropic conductive film between the chip bonding pad and the substrate bonding pad to electrically connected the chip bonding pad and the substrate bonding pad.

In the COF packaging method of the present invention, a depth of the first groove ranges from 10 microns to 100 microns.

In the COF packaging method of the present invention, a gap between the chip and the first groove of the flexible substrate ranges from 10 microns to 30 microns.

The COF packaging structure and the COF packaging method provided by the present invention can reduce an overall thickness of a traditional COF packaging structure, increase a tightness of bonding between the chip and the flexible substrate, and strengthen a stability of the bonding between the chip and the flexible substrate.

DETAILED DESCRIPTION OF PREFERRED EMBODIMENTS

The features and spirit of the present invention are described more clearly by the following detailed description of preferred embodiments, rather than limiting the scope of the present invention with the disclosed preferred embodiments. On the contrary, the present invention is to cover various changes and equivalent arrangements within the scope of claims of the present invention.

In a traditional chip-on-film (COF) packaging structure, a display panel and an electronic device motherboard are usually connected by a flexible substrate, and a chip is directly bonded on the flexible substrate. The present invention addresses disadvantages of the traditional COF packaging structure.

Figure 1:
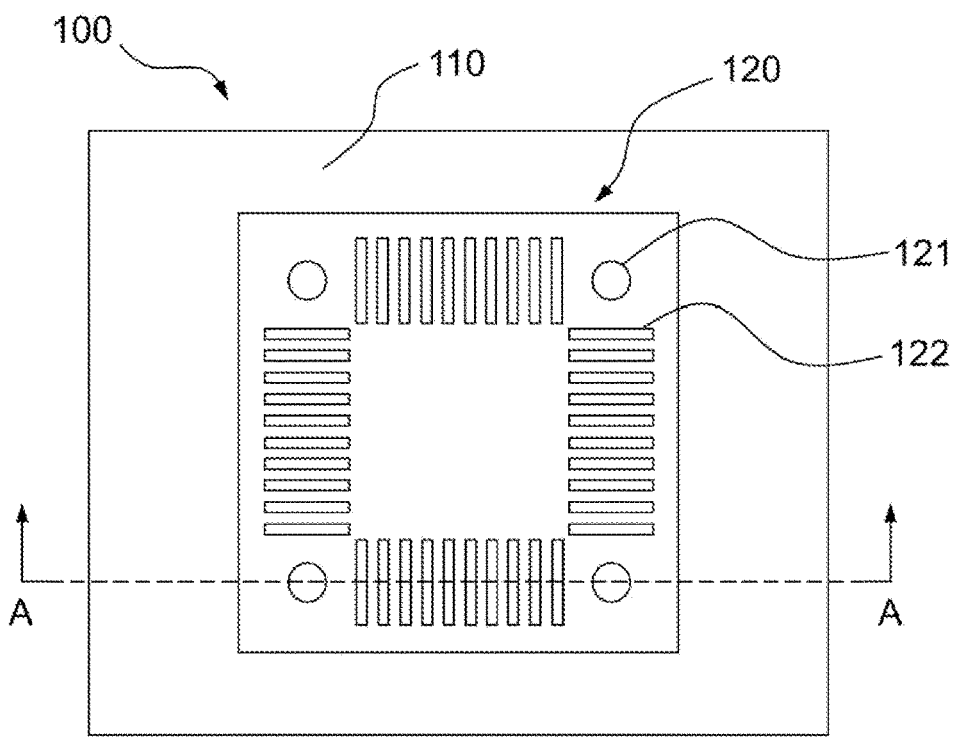
FIG. 1 is a schematic diagram of a structure of a flexible substrate of the present invention.
Figure 2:
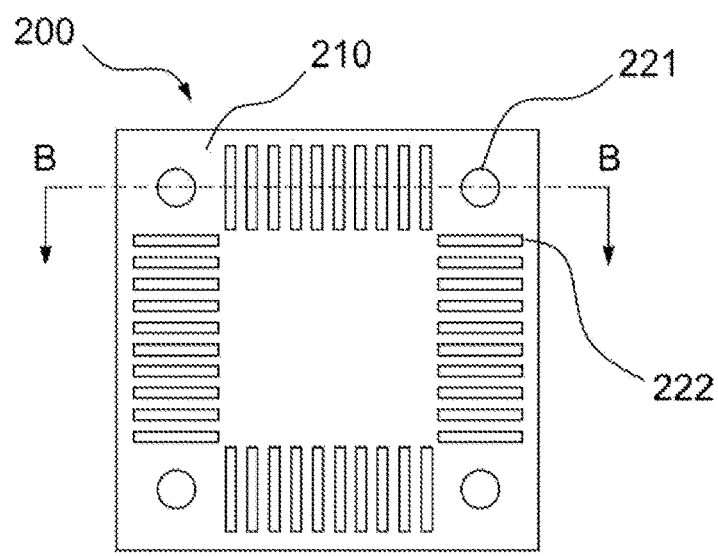
FIG. 2 is a schematic diagram of a structure of a chip of the present invention.

Please refer to FIGS. 1 and 2, FIG. 1 is a schematic diagram of a structure of a flexible substrate 100 of the present invention. FIG. 2 is a schematic diagram of a structure of a chip 200 of the present invention. A main surface of the flexible substrate 100 is a first surface 110. A main surface of the chip 200 is a second surface 210. The flexible substrate 100 is a film, and the film and the chip 200 disposed on the film form a COF packaging structure.

Firstly, the first surface 110 of the flexible substrate 100 is etched by a photolithography process to form a first groove 120 that matches a periphery shape of the chip 200. In the process of etching the flexible substrate 100, a periphery shape of the first groove 120 can be adjusted through a design of a mask, and a depth D of the first groove 120 can be adjusted through an etching time or processes.

In the present invention, the first groove 120 is provided with a protrusion 121. A height of the protrusion 121 is less than a depth of the first groove 120. In this embodiment, as shown in FIG. 1, four columnar protrusions 121 arranged at four corners of the first groove 120 are taken as an example for illustration. A shape of the protrusions 121 is not limited to a columnar shape, and can be a long dike shape. Also, the protrusions 121 are not limited to an even numbered arrangement or a symmetrical arrangement at corners or edges of the first groove 120. An actual implementation is not limited to this embodiment of the present invention. In the process of etching the flexible substrate 100, the mask is designed according to requirements, and the four protrusions 121 are regions of the flexible substrate 100 that are not etched. Correspondingly, in the present invention, on the second surface 210 of the chip 200, second grooves 221 matching with the protrusions 121 of the flexible substrate 100 are also etched by the photolithography process.

Because the first groove 120 of the flexible substrate 100 matches the periphery shape of the chip 200, and the second grooves 221 of the chip 200 match the protrusions 121 of the flexible substrate 100, the chip 200 can be embedded in the flexible substrate 100.

Secondly, in order to bond the chip 200 to the flexible substrate 100, the first groove 120 of the flexible substrate 100 is further provided with a substrate bonding pad 122, and the second surface 210 of the chip 200 is also provided with a chip bonding pad 222 corresponding to the substrate bonding pad 122. The substrate bonding pad 122 is configured as a circuit pin in the flexible substrate 100 to electrically connect to the chip bonding pad 222 of the chip 200. The substrate bonding pad 122 is disposed on a bottom of the first groove 120 and spaced with the protrusion 121. The chip bonding pad 222 is disposed outside the second groove 221.

Figure 3:
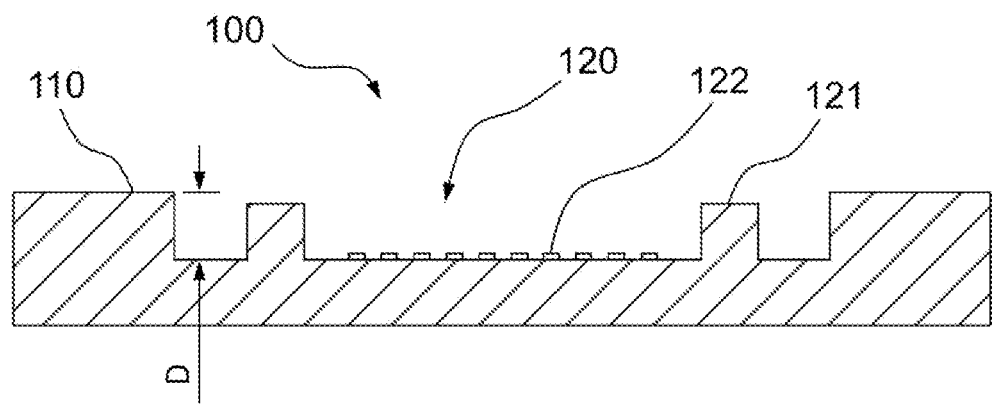
FIG. 3 is an enlarged view of a cross-section A-A in FIG. 1.

Please refer to FIG. 3, which is an enlarged view of a cross-section A-A in FIG. 1. In the present invention, the depth D of the first groove 120 where the flexible substrate 100 is etched ranges from $_{10}$ micrometers (μm) to 100 μm. Through calculations and experiments of the inventor, the depth D in this range can achieve an effect of thinning the flexible substrate 100 without affecting a material strength of the flexible substrate 100.

Figure 4:
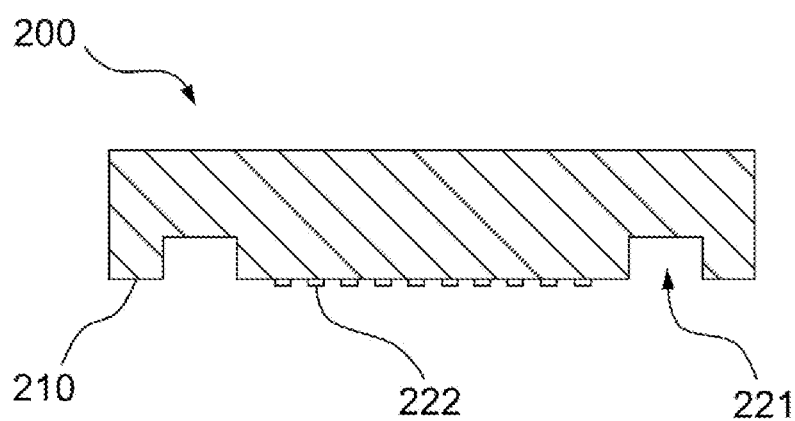
FIG. 4 is an enlarged view of a cross-section B-B in FIG. 2.

Please refer to FIG. 4, which is an enlarged view of a cross-section B-B in FIG. 2. It should be explained that the second grooves 221 are formed by cutting out the body of the chip 200, and a configuration of the second grooves 221 must be adjusted according to a design of an integrated circuit (not shown) inside the chip 200 so as to not affect a normal operation of the chip 200.

Figure 5:
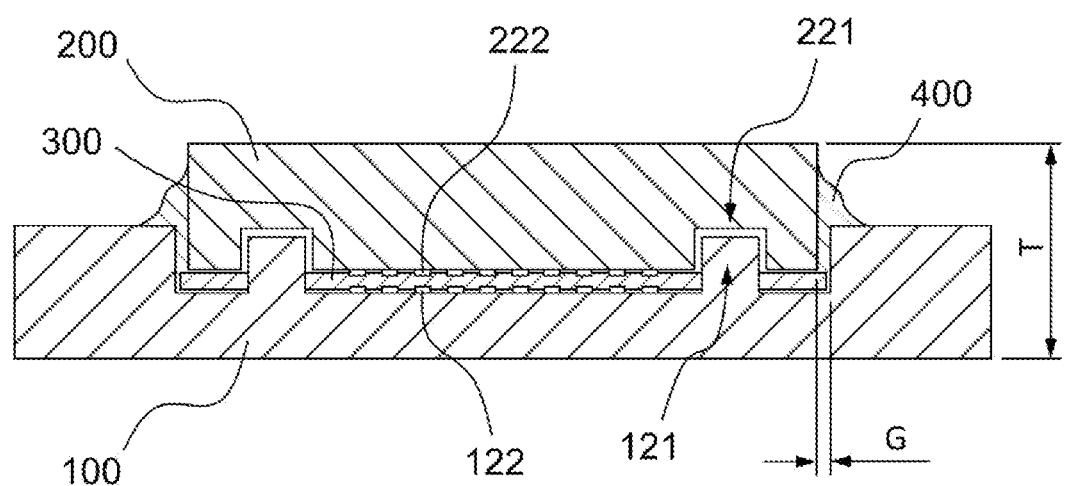
FIG. 5 is a schematic diagram of a chip-on-film packaging structure of the present invention.

Please refer to FIG. 5, which is a schematic diagram of the COF packaging structure of the present invention. When the chip 200 is bonded to the first groove 120 of the flexible substrate 100, the protrusions 121 of the first groove 120 can serve a purpose of positioning and limiting the chip 200. The second groove 221 of the chip 200 is correspondingly embedded in the protrusions 121 of the first groove 120.

An anisotropic conductive film (ACF) 300 is attached between the chip bonding pad 222 of the chip 200 and the substrate bonding pad 122 of the flexible substrate 100. The flexible substrate 100 and the chip 200 are effectively bonded to each other through the ACF 300.

In addition, the first groove 120 of the flexible substrate 100 matches the periphery shape of the chip 200, and the two are in clearance fit. In the present invention, the peripheral shape of the first groove 120 is configured to be approximately slightly larger than the peripheral shape of the chip 200 with a gap G between the chip 200 and a side wall of the first groove 120. The gap G ranges from 10 μm to 30 μm. Through calculations and experiments of the inventor, the gap G in this range can not only achieve a bendable characteristic of the flexible substrate 100, but also does not affect an offset or misalignment of bonding between the flexible substrate 100 and the chip 200.

After the flexible substrate 100 and the chip 200 are bonded to each other, the gap G between the chip 200 and the first groove 120 of the flexible substrate 100 is filled with a sealant 400 to protect a tightness of the bonding.

Compared with the traditional COF packaging structure, the COF packaging structure and the COF packaging method provided by the present invention can greatly reduce an overall thickness T of the COF packaging structure by about 10 μm to 100 μm. Moreover, a stability of the bonding between the chip 200 and the flexible substrate 100 can be enhanced by matching the second groove 221 of the chip 200 with the protrusion 121 of the first groove 120 of the flexible substrate 100. Meanwhile, the gap G between the chip 200 and the first groove 120 of the flexible substrate 100 is filled with the sealant 400, which can enhance the tightness of the bonding between the chip 200 and the flexible substrate 100.

Although the present invention has been disclosed above with the preferred embodiments, it is not intended to limit the present invention. Persons having ordinary skill in this technical field can still make various alterations and modifications without departing from the scope and spirit of this invention. Therefore, the scope of the present invention should be defined and protected by the following claims and their equivalents.

What is claimed is:

1. A chip-on-film (COF) packaging structure, comprising:
   a flexible substrate comprising a first groove provided on a first surface of the flexible substrate, a protrusion provided in the first groove, and a substrate bonding pad disposed in the first groove, wherein a height of the protrusion is less than a depth of the first groove, and the substrate bonding pad is disposed on a bottom of the first groove and spaced with the protrusion; the flexible substrate is a film; and
   a chip disposed on the film and comprising a second groove provided on a second surface of the chip, and a chip bonding pad disposed on the second surface and corresponding to the substrate bonding pad, wherein the chip bonding pad is disposed outside the second groove;
   wherein the first groove of the flexible substrate is matched with a peripheral shape of the chip, and the second groove is matched with the protrusion of the first groove to embed the chip in the flexible substrate; and
   wherein the chip bonding pad is electrically connected to the substrate bonding pad through an anisotropic conductive film.

2. The COF packaging structure according to claim 1, wherein a shape of the protrusion is a columnar shape or an embankment shape.

3. The COF packaging structure according to claim 1, wherein the protrusion is provided at a corner or an edge of the bottom of the first groove.

4. The COF packaging structure according to claim 1, wherein a depth of the first groove ranges from 10 microns to 100 microns.

5. The COF packaging structure according to claim 1, wherein a gap between the chip and a side wall of the first groove of the flexible substrate ranges from 10 microns to 30 microns.

6. The COF packaging structure according to claim 1, wherein a gap between the chip and a side wall of the first groove of the flexible substrate is filled with a sealant.

7. The COF packaging structure according to claim 1, wherein the first groove of the flexible substrate is formed by etching through a photolithography process.

8. The COF packaging structure according to claim 1, wherein the second groove of the chip is formed by etching through a photolithography process.

9. The COF packaging structure according to claim 1, wherein a surface of the anisotropic conductive film close to the substrate bonding pad is bonded onto the substrate bonding pad, and a surface of the anisotropic conductive film close to the chip bonding pad is bonded onto the chip bonding pad.

10. A chip-on-film (COF) packaging method, comprising steps of:
    step S10: providing a flexible substrate and a chip, wherein the flexible substrate is a film;
    step S20: forming a first groove on a first surface of the flexible substrate, wherein the first groove is matched with a peripheral shape of the chip, the first groove is provided with a protrusion, and a height of the protrusion is less than a depth of the first groove;
    step S30: disposing a substrate bonding pad in the first groove of the flexible substrate;
    step S40: forming a second groove on a second surface of the chip matched with the protrusion in the first groove, wherein the substrate bonding pad is disposed on a bottom of the first groove;
    step S50: disposing a chip bonding pad on the second surface of the chip corresponding to the substrate bonding pad, wherein the chip bonding pad is disposed outside the second groove; and
    step S60: embedding the chip in the flexible substrate and electrically connecting the chip bonding pad and the substrate bonding pad through an anisotropic conductive film;
    wherein the film and the chip disposed on the film form a COF packaging structure.

11. The COF packaging method according to claim 10, further comprising a step of:
    step S70: filling a gap between the chip and a side wall of the first groove of the flexible substrate with a sealant.

12. The COF packaging method according to claim 10, wherein step S20 further comprises a step of:
    step S21: etching the first surface of the flexible substrate to form the first groove through a photolithography process.

13. The COF packaging method according to claim 10, wherein in step S20, the protrusion is formed in a columnar shape or an embankment shape.

14. The COF packaging method according to claim 10, wherein in step S20, the protrusion is formed at a corner or an edge of the bottom of the first groove.

15. The COF packaging method according to claim 10, wherein step S40 further comprises a step of:
    step S41: etching the second surface of the chip to form the second groove through a photolithography process.

16. The COF packaging method according to claim 10, wherein a depth of the first groove ranges from 10 microns to 100 microns.

17. The COF packaging method according to claim 10, wherein a gap between the chip and a side wall of the first groove of the flexible substrate ranges from 10 microns to 30 microns.

* * * * *